(12) United States Patent
Lee et al.

(10) Patent No.: US 10,162,261 B2
(45) Date of Patent: Dec. 25, 2018

(54) NEGATIVE PHOTORESIST COMPOSITION FOR KRF LASER FOR FORMING SEMICONDUCTOR PATTERNS

(71) Applicant: YOUNG CHANG CHEMICAL CO., LTD, Seongju-gun, Gyeongsangbuk-do (KR)

(72) Inventors: Seung Hun Lee, Daegu (KR); Seung Hyun Lee, Daegu (KR); Sang Woong Yoon, Seoul (KR); Su Jin Lee, Daegu (KR); Young Cheol Choi, Gumi-si Gyeongsangbuk-do (KR)

(73) Assignee: YOUNG CHANG CHEMICAL CO., LTD, Seongju-gun, Gyeongsangbuk-do (KR)

( * ) Notice: Subject to any disclaimer, the term of this patent is extended or adjusted under 35 U.S.C. 154(b) by 0 days.

(21) Appl. No.: 15/744,667

(22) PCT Filed: Jun. 27, 2016

(86) PCT No.: PCT/KR2016/006820
§ 371 (c)(1),
(2) Date: Jan. 12, 2018

(87) PCT Pub. No.: WO2017/014438
PCT Pub. Date: Jan. 26, 2017

(65) Prior Publication Data
US 2018/0203351 A1    Jul. 19, 2018

(30) Foreign Application Priority Data

Jul. 22, 2015 (KR) .................. 10-2015-0103727

(51) Int. Cl.
*G03F 7/004* (2006.01)
*G03F 7/033* (2006.01)
*G03F 7/038* (2006.01)

(52) U.S. Cl.
CPC ............ *G03F 7/0382* (2013.01); *G03F 7/004* (2013.01); *G03F 7/0045* (2013.01); *G03F 7/033* (2013.01); *G03F 7/038* (2013.01); *G03F 7/0384* (2013.01)

(58) Field of Classification Search
USPC ...................................................... 430/280.1
See application file for complete search history.

(56) References Cited

U.S. PATENT DOCUMENTS

| 5,130,467 | A | * | 7/1992 | Mott | ....................... C07C 69/54 560/104 |
| 5,215,856 | A | * | 6/1993 | Jayaraman | ............ G03F 7/0226 430/165 |
| 5,612,164 | A | * | 3/1997 | Canize | .................... G03F 7/022 430/165 |
| 2007/0111139 | A1 | * | 5/2007 | Takeda | .................. G03F 7/0382 430/270.1 |
| 2009/0068574 | A1 | * | 3/2009 | Kitazawa | .............. G03F 7/0007 430/7 |
| 2010/0297439 | A1 | * | 11/2010 | Takayama | .............. C09J 163/00 428/345 |
| 2016/0362567 | A1 | * | 12/2016 | Ono | ......................... G02B 3/00 |
| 2018/0246404 | A1 | * | 8/2018 | Lee | ......................... G03F 7/004 |

FOREIGN PATENT DOCUMENTS

| JP | 2010-160300 A | 7/2010 |
| KR | 10-0266276 B1 | 6/2000 |
| KR | 10-2007-0052668 A | 5/2007 |
| KR | 10-2009-0019621 A | 2/2009 |
| KR | 10-2010-0027117 A | 3/2010 |
| KR | 10-2015-0026996 A | 3/2015 |
| KR | 10-2015-0047433 A | 5/2015 |
| KR | 10-2015-0067236 A | 6/2015 |

OTHER PUBLICATIONS

English translation of JP 2010-130300 a (2010), generated from from machine translation from AIPN Japan Patent Office National Center for Industrial Property Information and Training, generated Oct. 14, 2018, 43 pages (Year: 2018).*

* cited by examiner

*Primary Examiner* — Cynthia Hamilton
(74) *Attorney, Agent, or Firm* — Novick, Kim & Lee, PLLC; Jae Youn Kim

(57) ABSTRACT

Provided is a negative photoresist composition for a KrF laser for semiconductor pattern formation, which includes a predetermined compound in order to improve the properties of a conventional negative photoresist, thereby realizing high transparency, high resolution and an excellent profile, even in the presence of an exposure source having a short wavelength compared to the conventional negative photoresist, and is thus suitable for use in semiconductor processing.

7 Claims, No Drawings

NEGATIVE PHOTORESIST COMPOSITION FOR KRF LASER FOR FORMING SEMICONDUCTOR PATTERNS

TECHNICAL FIELD

The present invention relates to a negative photoresist composition for a KrF laser for semiconductor pattern formation.

BACKGROUND ART

With the recent demand to reduce the size and increase the degree of integration of semiconductor devices through the development of semiconductor manufacturing technology, techniques for forming ultrafine patterns having line widths corresponding to tens of nm or less are required. Advances in techniques for forming ultrafine patterns have been made by the use of light sources having smaller wavelengths and through the development of processing technology and photoresists suitable for such light sources.

A photoresist is used for photolithography for forming a variety of patterns. The term "photoresist" refers to a photosensitive resin, the solubility of which varies in a developing solution due to the action of light, to thus obtain an image corresponding to the exposure pattern.

The formation of a photoresist pattern includes negative tone development (NTD) using a negative tone developing solution and positive tone development (PTD) using a positive tone developing solution.

The process of forming a pattern through NTD includes selectively dissolving and removing an unexposed region using a negative tone developing solution, and the process of forming a pattern through PTD includes selectively dissolving and removing an exposed region using a positive tone developing solution.

When compared to pattern formation using PTD, pattern formation using NTD enables the formation of a reverse-phase pattern in a contact-hole pattern or a trench pattern, which is considered to be difficult to form due to insufficient exposure, thereby making it easy to consistently form a pattern. Furthermore, an organic solvent is used as the developing solution for removing the unexposed portion, thereby more effectively forming a photoresist pattern.

Meanwhile, a typical photolithography process using a photoresist composition includes coating a wafer with a photoresist, performing soft baking for heating the coated photoresist to evaporate the solvent, forming an image by means of a light source passed through a photomask, forming a pattern through a difference in solubility between an exposed portion and an unexposed portion using a developing solution, and completing a circuit through etching.

The photoresist composition is composed of a photosensitive agent (a photoacid generator) for generating an acid through excimer laser irradiation, a basic resin and other additives. The basic resin, configured such that a phenol structure contains a hydroxyl group, typically includes a polystyrene polymer, a cresol polymer, or a novolac polymer, and any photosensitive agent may be used, so long as it is able to generate an acid ($H^+$) at a specific wavelength, and examples thereof may include sulfonium-, sulfonyl diazo-, benzo sulfonyl-, iodine-, chlorine-, and carboxylic acid-based organic and inorganic acids.

However, a negative photoresist obtained using the above composition is problematic in that the photosensitive agent therein is unable to generate a sufficient amount of acid ($H^+$), making it impossible to form a desired shape, and also in that a profile deteriorates upon the formation of a finer pattern.

Also, a light source mainly used for the above process has a wavelength range of 365 nm to 193 nm, examples of which include an I-ray, a KrF excimer laser, and an ArF excimer laser. As is known in the art, the shorter the wavelength, the finer the pattern.

In particular, thorough research into a KrF laser (243 nm) photoresist for photo microprocessing is ongoing despite the development of an ArF laser (193 nm) system. This is because the development of next-generation ArF photoresists is still unsatisfactory and also because the use of a KrF photoresist may greatly reduce the cost for mass production of semiconductors. Accordingly, the performance of a KrF photoresist has to be improved in response to such technical development, and, for example, the thickness of the photoresist is required to decrease with an increase in the degree of integration. Hence, the development of a photoresist in which dry etching resistance is further increased is urgently required. In addition thereto, there are requirements for high resolution, a wide DOF (Depth Of Focus) margin, defect-free thin film formation, adhesion to a substrate, high contrast, fast sensitivity and chemical stability.

Conventional techniques pertaining to the negative photoresist for a KrF laser include Korean Patent No. 10-0266276 ⌈Negative photoresist composition⌋, Korean Patent Application Publication No. 10-2015-0067236 ⌈Negative photosensitive resin composition⌋, Korean Patent Application Publication No. 10-2015-0047433 ⌈Salt and photoresist composition including same⌋, and Korean Patent Application Publication No. 10-2015-0026996 ⌈Compound, resin, photoresist composition, and method of forming photoresist pattern⌋.

DISCLOSURE

Technical Problem

Accordingly, the present invention is intended to provide a negative photoresist composition for a KrF laser for semiconductor pattern formation, which enables the formation of a pattern having high transparency, high resolution, and a vertical cross-sectional profile, even in the presence of an exposure source having a short wavelength compared to a conventional negative photoresist using a KrF excimer laser.

Technical Solution

Therefore, the present invention provides a negative photoresist composition for a KrF laser, including at least one selected from the group consisting of compounds represented by Chemical Formulas 1 to 3 below.

[Chemical Formula 1]

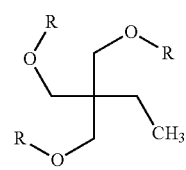

-continued

[Chemical Formula 2]

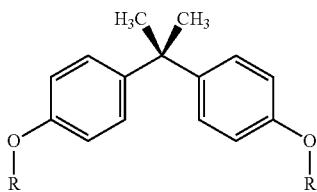

[Chemical Formula 3]

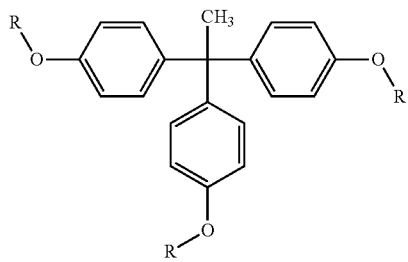

In the above Chemical Formulas, R groups may be the same as or different from each other, and are each independently any one selected from the group consisting of methyl, ethyl, butyl, pentyl, acryloyl, allyl, allyldimethylsilane, anthraquinonecarbonyl, acetophenyl and anthracene.

In a preferred embodiment of the present invention, respective compounds represented by Chemical Formulas 1 to 3 are obtained by subjecting 2-ethyl-2-hydroxymethyl-1,3-propanediol, bisphenol A and 1,1,1-tri(4-hydroxyphenyl) ethane to a substitution reaction with a monomer.

In a preferred embodiment of the present invention, each of the compounds represented by Chemical Formulas 1 to 3 has a weight average molecular weight ranging from 150 to 10,000.

In a preferred embodiment of the present invention, the composition includes, based on the total weight thereof, 5 to 60 wt % of a polymer resin, 0.1 to 4 wt % of at least one selected from the group consisting of compounds represented by Chemical Formulas 1 to 3, 1 to 10 wt % of a crosslinking agent, 0.1 to 10 wt % of a photoacid generator, 0.01 to 5 wt % of an acid diffusion inhibitor and the remainder of a solvent.

In a preferred embodiment of the present invention, the polymer resin is at least one selected from the group consisting of a phenol polymer resin and a cresol polymer resin, each of which has a hydroxyl group.

In a preferred embodiment of the present invention, the phenol polymer resin includes 4-hydroxy-3-methyl benzoic acid, 4-hydroxy-2-methyl benzoic acid, 5-hydroxy-2-methyl benzoic acid, 3,5-di-tert-butyl-4-hydroxy benzoic acid, 4-hydroxy-3,5-dimethyl benzoic acid, 4-hydroxy isophthalic acid, 2,4,6-hydroxy toluene, 2,4,6-trihydroxy benzoic acid monohydrate, and 2,4,6-trihydroxy benzaldehyde, and the cresol polymer resin includes o-cresol, p-cresol, m-cresol, epoxy o-cresol, epoxy p-cresol and epoxy m-cresol.

In a preferred embodiment of the present invention, the crosslinking agent includes at least one selected from the group consisting of tris(2,3-epoxypropyl)isocyanurate, trimethylolmethane triglycidyl ether, trimethylolpropane triglycidyl ether, hexamethylol melamine, trimethylolethane triglycidyl ether, hexamethoxymethyl melamine, hexamethoxyethyl melamine, tetramethylol 2,4-diamino-1,3,5-triazine, tetramethoxymethyl-2,4-diamino-1,3,5-triazine, tetramethylol glycoluril, tetramethoxymethyl glycoluril, tetramethoxyethyl glycoluril, tetramethylolurea, tetramethoxymethylurea, tetramethoxyethylurea and tetramethoxyethyl-2,4-diamino-1,3,5-triazine.

In a preferred embodiment of the present invention, the photoacid generator includes at least one selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonate, pyrogallol tris(alkylsulfonate), norbornene dicarboxyimide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboxyimide nonaflate, triphenylsulfonium perfluorooctane sulfonate, diphenyliodonium perfluorooctane sulfonate, methoxydiphenyliodonium perfluorooctane sulfonate, di-t-butyldiphenyliodonium perfluorooctane sulfonate, N-hydroxysuccinimide perfluorooctane sulfonate and norbornene dicarboxyimide perfluorooctane sulfonate.

In a preferred embodiment of the present invention, the acid diffusion inhibitor includes at least one selected from the group consisting of methyltriamine, ethyltriamine, dimethylamine, diethylamine, trimethylamine, triethylamine, tributylamine, methanol triamine, ethanol triamine, dimethanolamine, diethanolamine, trimethanolamine, triethanolamine and tributanolamine.

Advantageous Effects

According to the present invention, a negative photoresist composition for a KrF laser enables the formation of a pattern having high transparency, high resolution and an excellent profile, even in the presence of an exposure source having a short wavelength compared to a conventional negative photoresist, and is thus suitable for use in semiconductor processing.

BEST MODE

Unless otherwise defined, all the technical and scientific terms used herein have the same meanings as those typically understood by those skilled in the art to which the present invention belongs. Generally, the nomenclature used herein is well known in the art and is typical.

As used herein, when any part "includes" any element, this does not mean that other elements are excluded, and such other elements may be further included unless otherwise specifically mentioned.

As used herein, the term "photoresist" refers to a mixture comprising a polymer and a photosensitive agent, the chemical properties of which change upon radiation of light thereto, thus altering the solubility thereof in a predetermined solvent when exposed to light of any wavelength, and thus, an undissolved portion is left behind to thus form a pattern after the duration of the dissolution time due to the difference in dissolution rate between an exposed portion and an unexposed portion for the solvent.

As used herein, the term "photolithography" means that, when a mask having a semiconductor circuit design is disposed between a light source and a photoresist layer applied on a silicon wafer and the light source is turned on, the circuit of the mask is transferred onto the photoresist using the properties of the photoresist.

As used herein, the term "KrF laser" refers to a krypton fluoride (KrF) laser having a wavelength of 248 nm.

An embodiment of the present invention addresses a negative photoresist composition for a KrF laser, including at least one selected from the group consisting of compounds represented by Chemical Formulas 1 to 3 below.

[Chemical Formula 1]

[Chemical Formula 2]

[Chemical Formula 3]

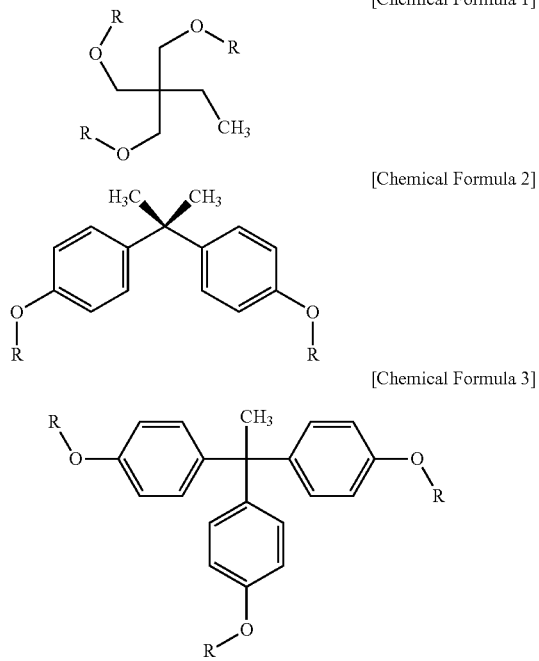

In the above Chemical Formulas, R groups may be the same as or different from each other, and are each independently any one selected from the group consisting of methyl, ethyl, butyl, pentyl, acryloyl, allyl, allyldimethylsilane, anthraquinonecarbonyl, acetophenyl and anthracene. Respective compounds represented by Chemical Formulas 1 to 3 are obtained by subjecting 2-ethyl-2-hydroxymethyl-1,3-propanediol, bisphenol A and 1,1,1-tri(4-hydroxyphenyl) ethane to a substitution reaction with a monomer.

The following Scheme 1 represents the substitution reaction of 2-ethyl-2-hydroxymethyl-1,3-propanediol and a monomer, the following Scheme 2 represents the substitution reaction of bisphenol A and a monomer, and the following Scheme 3 represents the substitution reaction of 1,1,1-tri(4-hydroxyphenyl)ethane and a monomer.

<Scheme 1>

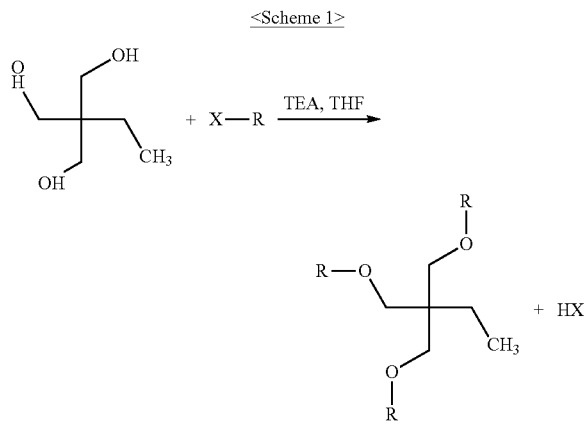

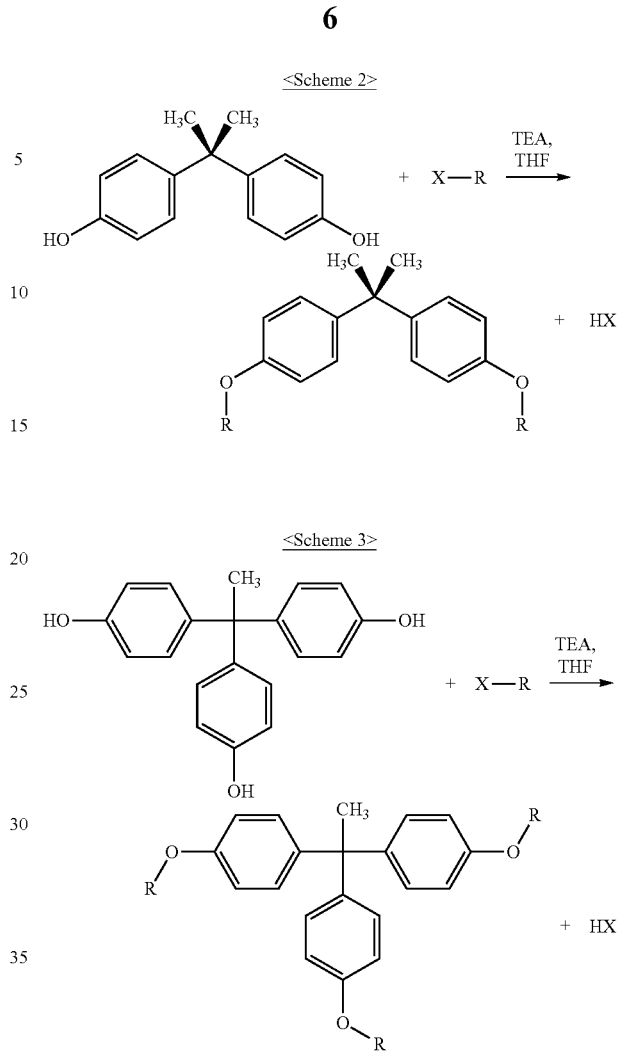

In Schemes 1 to 3, X—R represents a reactive monomer, in which X is at least one selected from the group consisting of Cl, NH$_2$, Br, OH and OCH$_3$, and R may be at least one selected from the group consisting of methyl, ethyl, butyl, pentyl, acryloyl, allyl, allyldimethylsilane, anthraquinonecarbonyl, acetophenyl and anthracene.

Specific examples of the reactive monomer may include chloromethane, chloroethane, chlorobutane, chloropentane, acryloyl chloride, allyl chloride, allyl chloride dimethylsilane, anthraquinone carbonyl chloride, chloroacetophenone, and chloroanthracene.

Each of the compounds represented by Chemical Formulas 1 to 3 obtained through the above substitution reactions may have a weight average molecular weight ranging from 150 to 10,000.

According to the present invention, the negative photoresist composition for a KrF laser may include, based on the total weight of the composition, 5 to 60 wt % of a polymer resin, 0.1 to 4 wt % of at least one selected from the group consisting of compounds represented by Chemical Formulas 1 to 3, 1 to 10 wt % of a crosslinking agent, 0.1 to 10 wt % of a photoacid generator, 0.01 to 5 wt % of an acid diffusion inhibitor and the remainder of a solvent.

Here, at least one compound selected from the group consisting of compounds represented by Chemical Formulas 1 to 3 is preferably contained in an amount of 0.1 to 4 wt % based on the total weight of the composition. If the amount of the compound is less than 0.1 wt %, pattern roughness defects may occur. On the other hand, if the amount thereof exceeds 4 wt %, problems such as low retention rate and pattern footing may occur.

The polymer resin may be at least one selected from the group consisting of a phenol polymer resin and a cresol polymer resin, each of which has a hydroxyl group.

More specifically, the phenol polymer resin may include 4-hydroxy-3-methyl benzoic acid, 4-hydroxy-2-methyl benzoic acid, 5-hydroxy-2-methyl benzoic acid, 3,5-di-tert-butyl-4-hydroxy benzoic acid, 4-hydroxy-3,5-dimethyl benzoic acid, 4-hydroxy isophthalic acid, 2,4,6-hydroxy toluene, 2,4,6-trihydroxy benzoic acid monohydrate, and 2,4,6-trihydroxy benzaldehyde, and the cresol polymer resin may include o-cresol, p-cresol, m-cresol, epoxy o-cresol, epoxy p-cresol and epoxy m-cresol, having a hydroxyl group.

The polymer resin is preferably contained in an amount of 5 to 60 wt % based on the total weight of the composition. If the amount of the polymer resin is less than 5 wt %, high exposure energy is required upon patterning and development. On the other hand, if the amount thereof exceeds 60 wt %, it is difficult to form a uniform pattern, undesirably generating a residue.

The crosslinking agent may include at least one selected from the group consisting of tris(2,3-epoxypropyl)isocyanurate, trimethylolmethane triglycidyl ether, trimethylolpropane triglycidyl ether, hexamethylol melamine, trimethylolethane triglycidyl ether, hexamethoxymethyl melamine, hexamethoxyethyl melamine, tetramethylol 2,4-diamino-1,3,5-triazine, tetramethoxymethyl-2,4-diamino-1,3,5-triazine, tetramethylol glycoluril, tetramethoxymethyl glycoluril, tetramethoxyethyl glycoluril, tetramethylolurea, tetramethoxymethylurea, tetramethoxyethylurea and tetramethoxyethyl-2,4-diamino-1,3,5-triazine.

The crosslinking agent is preferably contained in an amount of 1 to 10 wt % based on the total weight of the composition. If the amount of the crosslinking agent is less than 1 wt %, pattern formation may become impossible owing to the low retention rate. On the other hand, if the amount thereof exceeds 10 wt %, defects may take place owing to bridging between patterns due to excessive crosslinking.

The photoacid generator may include at least one selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonate, pyrogallol tris(alkylsulfonate), norbornene dicarboxyimide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboxyimide nonaflate, triphenylsulfonium perfluorooctane sulfonate, diphenyliodonium perfluorooctane sulfonate, methoxydiphenyliodonium perfluorooctane sulfonate, di-t-butyldiphenyliodonium perfluorooctane sulfonate, N-hydroxysuccinimide perfluorooctane sulfonate and norbornene dicarboxyimide perfluorooctane sulfonate.

The photoacid generator is preferably contained in an amount of 0.1 to 10 wt %, based on the total weight of the composition. If the amount of the photoacid generator is less than 0.1 wt %, pattern formation may become impossible due to the lack of crosslinking density. On the other hand, if the amount thereof exceeds 10 wt %, pattern defects may occur in which the wall or edge of the pattern may deteriorate (LWR, LER) owing to excessive acid generation.

The acid diffusion inhibitor may include at least one selected from the group consisting of methyltriamine, ethyltriamine, dimethylamine, diethylamine, trimethylamine, triethylamine, tributylamine, methanol triamine, ethanol triamine, dimethanolamine, diethanolamine, trimethanolamine, triethanolamine and tributanolamine.

The acid diffusion inhibitor is preferably contained in an amount of 0.01 to 5 wt % based on the total weight of the composition. If the amount of the acid diffusion inhibitor is less than 0.01 wt %, pattern defects may occur in which the wall or edge of the pattern may deteriorate (LWR, LER) owing to excessive acid generation. On the other hand, if the amount thereof exceeds 5 wt %, pattern formation may become impossible.

Meanwhile, the negative photoresist composition for a KrF laser according to the present invention may be used at 1,000 Å to 100,000 Å depending on the type and amount of solvent that is used, and may be dissolved in an amount of 10 to 90 wt % relative to the weight of the solvent, and may then be used.

Examples of the solvent may include ethyleneglycol monomethylether, ethyleneglycol monoethylether, methylcellosolve acetate, ethylcellosolve acetate, diethyleneglycol monomethylether, diethyleneglycol monoethylether, propyleneglycol methyl ether acetate, propyleneglycol propyl ether acetate, diethyleneglycol dimethylether, ethyl lactate, toluene, xylene, methylethylketone, cyclohexanone, 2-heptanone, 3-heptanone, and 4-heptanone, which may be used alone or in combination.

As described above, the negative photoresist composition for a KrF laser according to the present invention includes at least one selected from the group consisting of compounds represented by Chemical Formulas 1 to 3, thereby realizing high resolution and an excellent profile even in the presence of an exposure source having a short wavelength, and is thus suitable for use in semiconductor processing.

MODE FOR INVENTION

Examples

A better understanding of the present invention may be obtained through the following examples, which are set forth to illustrate, but are not to be construed as limiting the scope of the present invention, as is apparent to those skilled in the art.

Substitution Example 1

In a three-neck 500 ml round-bottom flask equipped with an argon reflux device, 13.4 g of 2-ethyl-2-hydroxymethyl-1,3-propanediol, 52.2 g of triethylamine and 200 ml of anhydrous tetrahydrofuran were placed and stirred using a magnetic bar. Stirring was performed for 10 min in an argon atmosphere, after which 31.6 g of acryloyl chloride was slowly added over 10 min using a dropping funnel and then stirred at room temperature for 2 hr, and the resulting reaction product was filtered and then washed with water two times. The filtered product was completely dissolved in 150 ml of chloroform and then purified five times using a 500 ml separatory funnel. Thereafter, the product, dissolved in chloroform, was further purified through column chromatography using a solvent comprising methylene chloride and hexane at a content ratio of 1:1 to remove unreacted materials, ultimately yielding a white solid product having a weight average molecule weight of 204, as represented by Chemical Formula 1 (R: acryloyl). Based on the results of NMR analysis thereof, unreacted materials were not detected.

Substitution Example 2

In a three-neck 500 ml round-bottom flask equipped with an argon reflux device, 22.8 g of bisphenol A, 37.2 g of triethylamine and 200 ml of anhydrous tetrahydrofuran were placed and stirred using a magnetic bar. Stirring was performed for 10 min in an argon atmosphere, after which 22.6 g of acryloyl chloride was slowly added over 10 min using a dropping funnel and then stirred at room temperature for 2 hr, and the resulting reaction product was filtered and then washed with water two times. The filtered product was completely dissolved in 150 ml of chloroform and then purified five times using a 500 ml separatory funnel. Thereafter, the product, dissolved in chloroform, was further purified through column chromatography using a solvent comprising methylene chloride and hexane at a content ratio of 1:1 to remove unreacted materials, ultimately yielding a white solid product having a weight average molecule weight of 298, as represented by Chemical Formula 2 (R: acryloyl). Based on the results of NMR analysis thereof, unreacted materials were not detected.

Substitution Example 3

In a three-neck 500 ml round-bottom flask equipped with an argon reflux device, 30.6 g of 1,1,1-tri(4-hydroxyphenyl) ethane, 52.2 g of triethylamine and 200 ml of anhydrous tetrahydrofuran were placed and stirred using a magnetic bar. Stirring was performed for 10 min in an argon atmosphere, after which 31.6 g of acryloyl chloride was slowly added over 10 min using a dropping funnel and then stirred at room temperature for 2 hr, and the resulting reaction product was filtered and then washed with water two times. The filtered product was completely dissolved in 150 ml of chloroform and then purified five times using a 500 ml separatory funnel. Thereafter, the product, dissolved in chloroform, was further purified through column chromatography using a solvent comprising methylene chloride and hexane at a content ratio of 1:1 to remove unreacted materials, ultimately yielding a white solid product having a weight average molecule weight of 376, as represented by Chemical Formula 3 (R: acryloyl). Based on the results of NMR analysis thereof, unreacted materials were not detected.

Example 1

A negative photoresist composition for a KrF excimer laser was prepared by mixing 80 g of a basic resin, namely a phenol polymer resin having a weight average molecular weight of 5,000, 4 g of the compound obtained in Substitution Example 1, 4 g of a photoacid generator, namely triphenylsulfonium nonaflate, 10 g of a crosslinking agent, namely tetramethoxymethyl glycoluril, 0.6 g of an acid diffusion inhibitor, namely tributylamine, and a solvent comprising 150 g of ethyl lactate and 700 g of propyleneglycol methyl ether acetate. The prepared composition was filtered using a 0.1 μm Teflon syringe filter, applied on a silicon wafer using a spin coater, soft-baked at 100° C. for 90 sec, and exposed under a light source at 248 nm. After completion of the exposure process, a baking process at 110° C. for 90 sec and a developing process using 2.38% tetramethylammonium hydroxide were carried out to thus form a pattern. Consequently, a good negative pattern, having a profile with a positive slope at an energy of 40 mJ/cm$^2$ and a line/space resolution of 0.2 μm, was obtained.

Example 2

The same procedures as in Example 1 were performed, with the exception that 4 g of the compound of Substitution Example 2 was used in lieu of the compound of Substitution Example 1. Consequently, a good negative pattern, having a profile with a vertical slope at an energy of 36 mJ/cm$^2$ and a line/space resolution of 0.18 Lm, was obtained.

Example 3

The same procedures as in Example 1 were performed, with the exception that 40 g of the compound of Substitution Example 2 was used in lieu of the compound of Substitution Example 1. Consequently, a relatively good negative pattern, having a profile with a positive slope at an energy of 41 mJ/cm$^2$ and a line/space resolution of 0.25 μm, was obtained.

Example 4

The same procedures as in Example 1 were performed, with the exception that 4 g of the compound of Substitution Example 3 was used in lieu of the compound of Substitution Example 1. Consequently, a good negative pattern, having a profile with a positive slope at an energy of 35 mJ/cm$^2$ and a line/space resolution of 0.2 μm, was obtained.

Example 5

The same procedures as in Example 1 were performed, with the exception that 40 g of the compound of Substitution Example 3 was used in lieu of the compound of Substitution Example 1. Consequently, a relatively good negative pattern, having a profile with a positive slope at an energy of 45 mJ/cm$^2$ and a line/space resolution of 0.5 μm, was obtained.

Example 6

The same procedures as in Example 1 were performed, with the exception that 2 wt % of the compound of Substitution Example 1 and 2 g of the compound of Substitution Example 2 were used. Consequently, a good negative pattern, having a profile with a vertical slope at an energy of 35 mJ/cm$^2$ and a line/space resolution of 0.2 μm, was obtained.

Example 7

The same procedures as in Example 1 were performed, with the exception that 1 g of the compound of Substitution Example 1 and 3 g of the compound of Substitution Example 2 were used. Consequently, a good negative pattern, having a profile with a vertical slope at an energy of 35 mJ/cm$^2$ and a line/space resolution of 0.18 Rpm, was obtained.

Comparative Example 1

The same procedures as in Example 1 were performed, with the exception that the compound of Substitution Example 1 was not added. Consequently, a good negative pattern, having a profile with a positive slope at an energy of 40 mJ/cm$^2$ and a line/space resolution of 0.25 μm, was obtained.

Measurement of Properties

The properties of the negative photoresist compositions for the KrF excimer laser prepared in Examples 1 to 7 and Comparative Example 1 were measured.

The resolution was determined by measuring an L/S (Line, Space) minimum line width (resolution) using a critical-dimension-scanning electron microscope (CD-SEM) for observing a pattern line width (critical dimension). Also, the energy able to determine the minimum line width (resolution) was measured and taken as the sensitivity.

The results are shown in Table 1 below.

TABLE 1

|  | Sensitivity (mJ/cm$^2$) | Resolution (μm) |
| --- | --- | --- |
| Example 1 | 40 | 0.2 |
| Example 2 | 36 | 0.18 |
| Example 3 | 41 | 0.25 |
| Example 4 | 35 | 0.2 |
| Example 5 | 45 | 0.5 |
| Example 6 | 35 | 0.2 |
| Example 7 | 35 | 0.18 |
| Comparative Example 1 | 40 | 0.25 |

As is apparent from Table 1, Examples 1, 2, 4, 6 and 7 exhibited high sensitivity and high resolution compared to Comparative Example 1, but the sensitivity and resolution were lower in Examples 3 and 5 than in Comparative Example 1. In Examples 3 and 5, the respective compounds of Substitution Examples 2 and 3 were excessively added and thus a larger amount of energy was required upon patterning, ultimately decreasing sensitivity, and resolution was also decreased due to the formation of non-uniform patterns.

In conclusion, when at least one selected from the group consisting of compounds represented by Chemical Formulas 1 to 3 is contained in an optimal amount, a negative photoresist composition for a KrF laser, capable of increasing resolution and sensitivity by virtue of high transparency, can be obtained.

All simple modifications or variations of the present invention may be easily performed by those skilled in the art, and may be incorporated in the scope of the present invention.

The invention claimed is:

1. A negative photoresist composition for a KrF laser, comprising 5 to 60 wt % of a polymer resin, 0.1 to 4 wt % of a compound represented by Chemical Formula 3 below, 1 to 10 wt % of a crosslinking agent, 0.1 to 10 wt % of a photoacid generator, 0.01 to 5 wt % of an acid diffusion inhibitor and a remainder of a solvent:

[Chemical Formula 3]

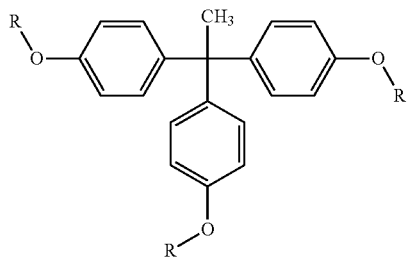

in Chemical Formula 3, R is acryloyl.

2. The negative photoresist composition of claim 1, wherein the compound represented by Chemical Formula 3 is obtained by subjecting 1,1,1-tri(4-hydroxyphenyl)ethane to a substitution reaction with acryloyl chloride.

3. The negative photoresist composition of claim 1, wherein the polymer resin is at least one selected from the group consisting of a phenol polymer resin and a cresol polymer resin, each having a hydroxyl group.

4. The negative photoresist composition of claim 3, wherein the phenol polymer resin is obtained from at least one monomer selected from the group consisting of 4-hydroxy-3-methyl benzoic acid, 4-hydroxy-2-methyl benzoic acid, 5-hydroxy-2-methyl benzoic acid, 3,5-di-tert-butyl-4-hydroxy benzoic acid, 4-hydroxy-3,5-dimethyl benzoic acid, 4-hydroxy isophthalic acid, 2,4,6-hydroxy toluene, 2,4,6-trihydroxy benzoic acid monohydrate and 2,4,6-trihydroxy benzaldehyde, and the cresol polymer resin is obtained from at least one monomer selected from the group consisting of o-cresol, p-cresol, m-cresol, epoxy o-cresol, epoxy p-cresol and epoxy m-cresol.

5. The negative photoresist composition of claim 1, wherein the crosslinking agent includes at least one selected from the group consisting of tris(2,3-epoxypropyl)isocyanurate, trimethylolmethane triglycidyl ether, trimethylolpropane triglycidyl ether, hexamethylol melamine, trimethylolethane triglycidyl ether, hexamethoxymethyl melamine, hexamethoxyethyl melamine, tetramethylol 2,4-diamino-1,3,5-triazine, tetramethoxymethyl-2,4-diamino-1,3,5-triazine, tetramethylol glycoluril, tetramethoxymethyl glycoluril, tetramethoxyethyl glycoluril, tetramethylolurea, tetramethoxymethylurea, tetramethoxyethylurea and tetramethoxyethyl-2,4-diamino-1,3,5-triazine.

6. The negative photoresist composition of claim 1, wherein the photoacid generator includes at least one selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, norbornene dicarboxyimide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboxyimide nonaflate, triphenylsulfonium perfluorooctane sulfonate, diphenyl iodonium perfluorooctane sulfonate, methoxydiphenyl iodonium perfluorooctane sulfonate, di-t-butyldiphenyliodonium perfluorooctane sulfonate, N-hydroxysuccinimide perfluorooctane sulfonate and norbornene dicarboxyimide perfluorooctane sulfonate.

7. The negative photoresist composition of claim 1, wherein the acid diffusion inhibitor includes at least one selected from the group consisting of dimethylamine, diethylamine, trimethylamine, triethylamine, tributylamine, dimethanolamine, diethanolamine, trimethanolamine, triethanolamine and tributanolamine.

* * * * *